United States Patent
Watanabe

(10) Patent No.: US 7,102,432 B2
(45) Date of Patent: Sep. 5, 2006

(54) CLASS D AMPLIFIER

(75) Inventor: Shinichi Watanabe, Tokyo (JP)

(73) Assignee: Nippon Precision Circuits Inc., Tokyo (JP)

( * ) Notice: Subject to any disclaimer, the term of this patent is extended or adjusted under 35 U.S.C. 154(b) by 71 days.

(21) Appl. No.: 10/999,172

(22) Filed: Nov. 29, 2004

(65) Prior Publication Data

US 2005/0122169 A1    Jun. 9, 2005

(30) Foreign Application Priority Data

Dec. 1, 2003    (JP) ............................. 2003-402173

(51) Int. Cl.
*H03F 3/217* (2006.01)
*H03K 4/06* (2006.01)

(52) U.S. Cl. ...................... 330/251; 327/131

(58) Field of Classification Search ............... 330/251, 330/207 A; 370/212, 213; 327/131, 133
See application file for complete search history.

(56) References Cited

U.S. PATENT DOCUMENTS

| | | | |
|---|---|---|---|
| 5,389,829 A | 2/1995 | Milazzo | 327/172 |
| 5,523,712 A | 6/1996 | Miyabe et al. | 327/355 |
| 5,804,999 A * | 9/1998 | DeBoer et al. | 327/110 |
| 6,137,365 A | 10/2000 | Wakairo et al. | 330/282 |
| 6,346,852 B1 * | 2/2002 | Masini et al. | 330/10 |

* cited by examiner

*Primary Examiner*—Robert Pascal
*Assistant Examiner*—Alan Wong
(74) *Attorney, Agent, or Firm*—Adams & Wilks

(57) ABSTRACT

A class D amplifier capable of compressing a dynamic range and reproduction by changing on a real time basis a modulation ratio to a non-linear ratio in accordance with amplitude of an input signal. The class D amplifier including a triangular waveform generation circuit that generates a deformed triangular waveform used as a comparison waveform for amplitude modulating an analog input signal, the triangular waveform generation circuit comprising a pulse generation circuit for generating a plurality of first pulse signals, a plurality of pulse extraction circuit for extracting said first pulse signals selectively, and for outputting second pulse signals during the time according to extracted first pulse signals, a plurality of three state buffers to which a clock pulse signal for basic cycles is provided as an input signal, one of said second pulse signals is provided as a control signal, and said clock pulse signal for basic cycles is output during a period for said one of second pulse signal is provided, and a integration circuit, having a time constant thereof changing in accordance with the output of said three state buffer, for generating said deformed triangular waveform corresponding to the time constant based on the clock pulse signal for basic cycles.

9 Claims, 6 Drawing Sheets

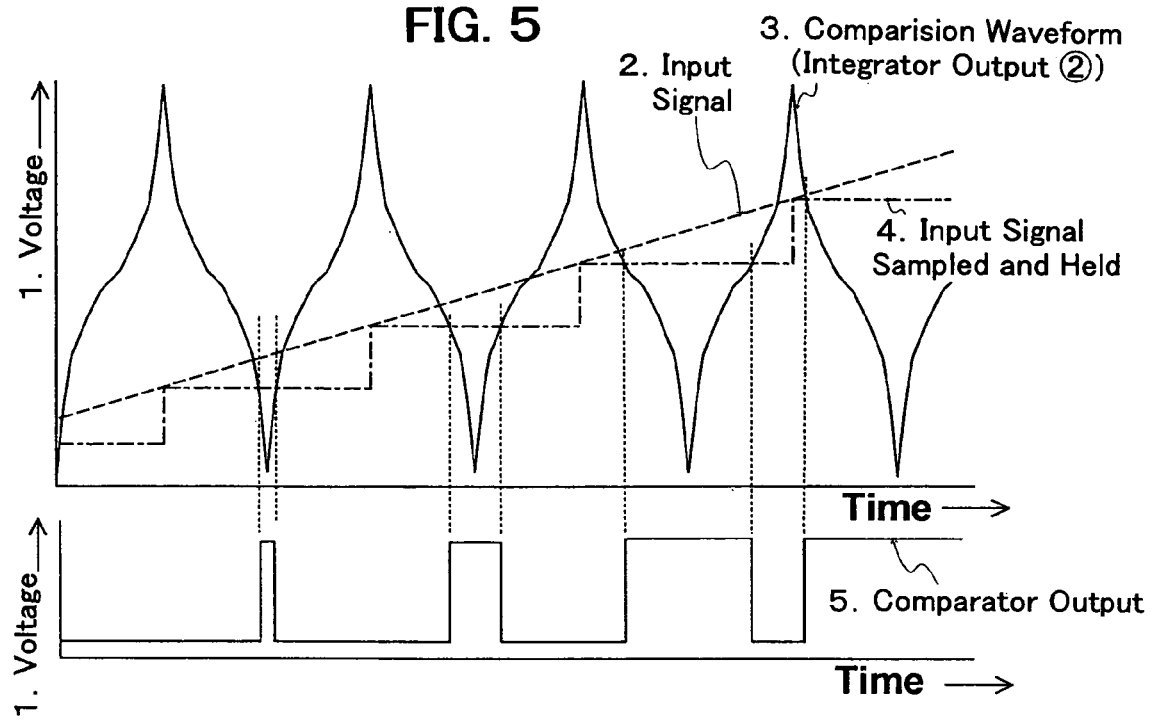
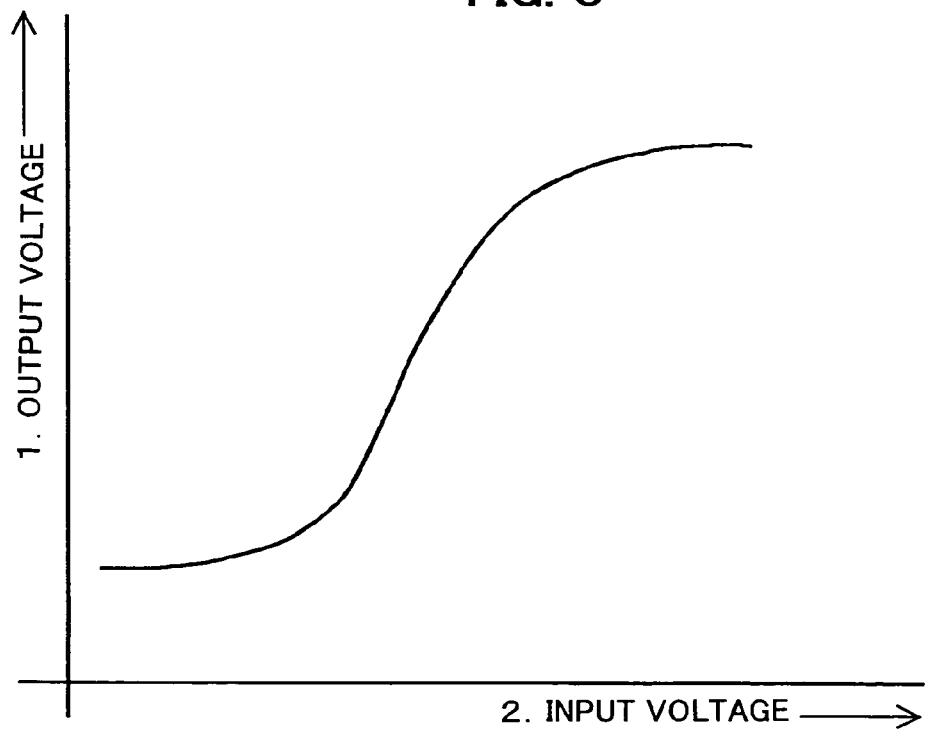

CLASS D AMPLIFIER

BACKGROUND OF THE INVENTION

1. Field of the Invention

In a class D amplifier for driving highly efficiently speakers in an acoustic apparatus, this invention relates to a class D amplifier equipped with a circuit for generating a deformed triangular wave as a comparison waveform necessary for conducting pulse amplitude modulation of an analog input waveform.

2. Description of the Related Art

The class D amplifier according to the prior art uses a triangular wave as a comparison waveform necessary for conducting pulse amplitude modulation of an analog input waveform and this triangular wave is generated from a rectangular wave by using an integration circuit (refer to JP-A-6-319197).

When the triangular wave is used, however, a modulation ratio is likely to get into saturation when pulse amplitude modulation of an input signal having amplitude exceeding the crest of the triangular wave is conducted. Because the input/output characteristics are linear, a large number of odd-numbered order harmonics develop at a large amplitude output reaching the saturation level and DC components are applied for a long time to the speakers as a load. These drawbacks become more remarkable when a power source voltage of the amplification portion is lower.

SUMMARY OF THE INVENTION

The invention is directed to provide a class D amplifier that can eliminate these problems of the prior art, compresses a dynamic range by changing an amplification ratio to a non-linear ratio on the real time basis in accordance with the amplitude of the input signal and reproduces the input signal.

To accomplish the object described above, a class D amplifier including a triangular waveform generation circuit that generates a deformed triangular waveform used as a comparison waveform for amplitude modulating an analog input signal, the triangular waveform generation circuit comprising a pulse generation circuit for generating a plurality of first pulse signals, a plurality of pulse extraction circuit for extracting said first pulse signals selectively, and for outputting second pulse signals during the time according to extracted first pulse signals, a plurality of three state buffers to which a clock pulse signal for basic cycles is provided as an input signal, one of said second pulse signals is provided as a control signal, and said clock pulse signal for basic cycles is output during a period for said one of second pulse signal is provided, and a integration circuit, having a time constant thereof changing in accordance with the output of said three state buffer, for generating said deformed triangular waveform corresponding to the time constant based on the clock pulse signal for basic cycles.

According to the class D amplifier of the invention, the modulation ratio is non-linearly changed on a real time basis in accordance with the amplitude of the input signal so that the amplification ratio can be increased when a small signal is inputted and can be decreased when a large signal is inputted, and the occurrence of large higher harmonics resulting from saturation at the time of the input of the large signal can be suppressed. In addition to the above, reproduction can be made while a mean acoustic level of the output from the speakers is raised and a dynamic range is compressed.

BRIEF DESCRIPTION OF THE DRAWINGS

FIG. 5 is a signal waveform diagram of a class D amplifier using the deformed comparison triangular waveform;

FIG. 6 is an input/output characteristic diagram of the class D amplifier using the deformed comparison triangular waveform.

DESCRIPTION OF THE PREFERRED EMBODIMENT

Figure 1:
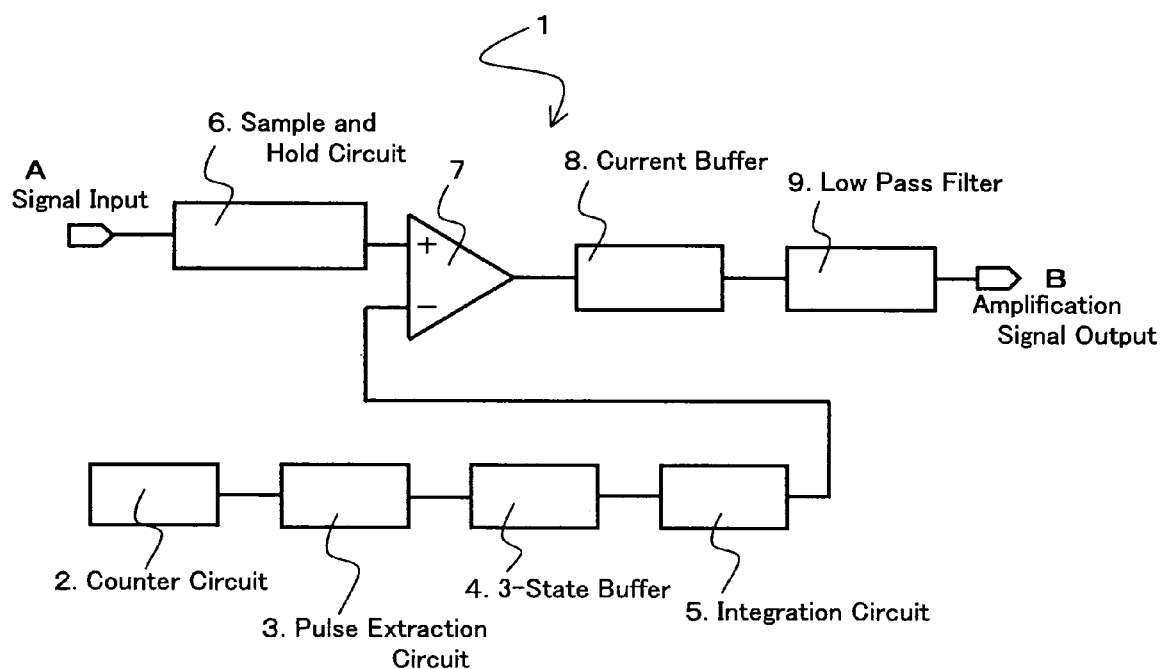
FIG. 1 is a block diagram showing a construction of a class D amplifier.

A preferred embodiment of the invention will be hereinafter explained with reference to the accompanying drawings. First, an overall construction of a class D amplifier to which the invention is applied will be explained with reference to a block diagram of FIG. 1. As shown in FIG. 1, the class D amplifier 1 includes a counter circuit 2 as a pulse generation circuit, a pulse extraction circuit 3, a 3-state buffer 4, an integration circuit 5, a sample-and-hold circuit 6, a comparator 7, a current buffer 8 and a low-pass filter 9. The counter circuit 2, the pulse extraction circuit 3, the 3-state buffer 4 and the integration circuit 5 constitute a comparison waveform generation circuit according to the invention. Each constituent element other than the comparison waveform generation circuit has the same construction and the same function as those of the prior art circuits.

Figure 2:
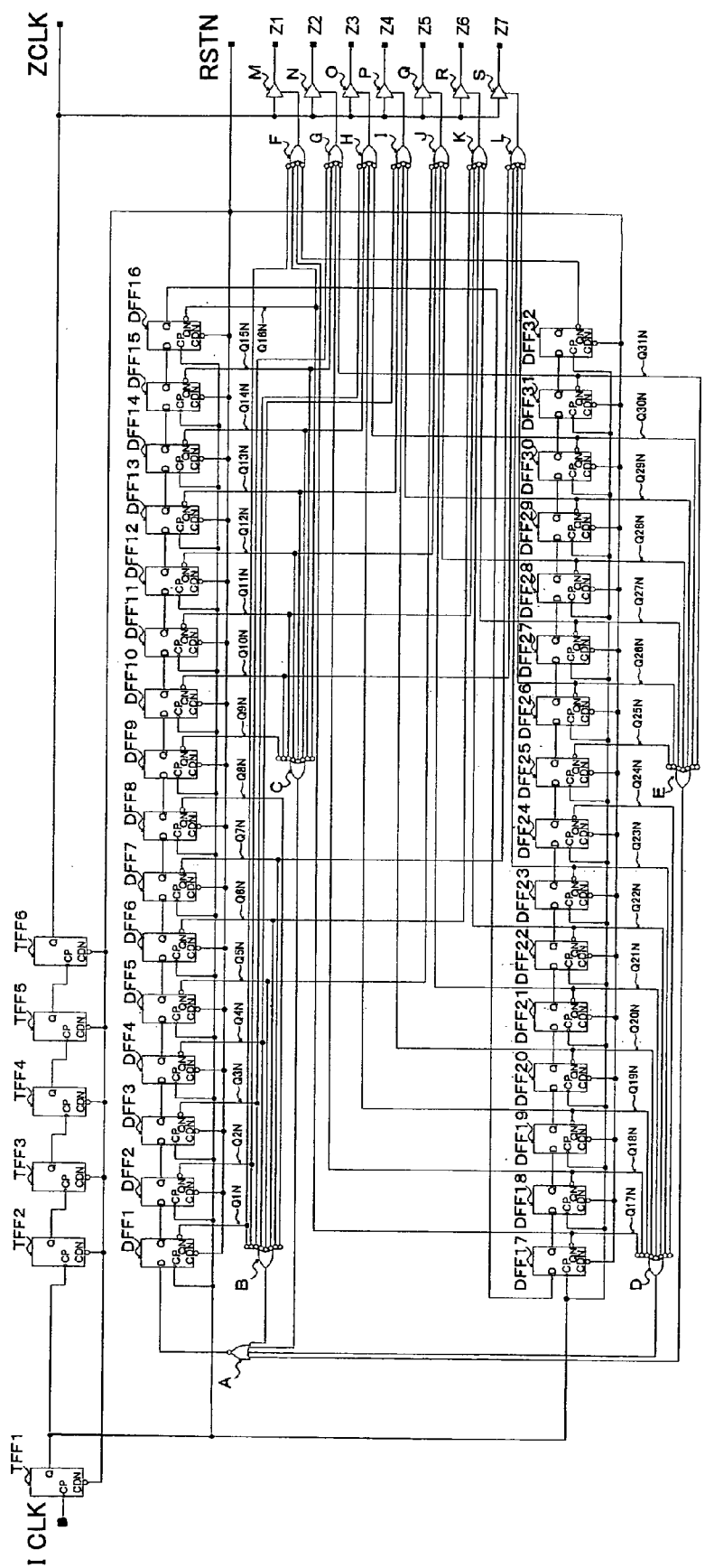
FIG. 2 is a block diagram showing a construction of a comparison waveform generation circuit.

Next, the comparison waveform generation circuit will be explained in detail with reference to FIG. 2. The counter circuit 2 is constituted into a ring counter including 32 delay flip-flops (hereinafter called "DFF") 1 to 32. The pulse extraction circuit 3 is constituted by seven 4-NAND gates F to L. An output terminal Q of each DFF 1 to 31 is connected to an input terminal D of a next stage and an inversion output terminal QN (a terminal that generates an output having an inverted logic level relative to the output terminal Q) of DFF 32 of the last stage is connected to one of the input terminals of the 4-NAND gate F. A reset terminal CDN of each DFF 1 to 32 is connected to a common terminal RSTN. A logic level of the output terminal Q of each DFF 1 to 32 changes to an "H" level when a reset signal is inputted from the terminal RSTN. A clock terminal CP of each DFF 1 to 32 is connected to the output terminal Q of a common toggle flip-flop (hereinafter called "TFF") 1. A counting operation is made by fetching an output from a subsequent stage whenever the clock pulse from this output terminal Q rises.

An ICLK pulse is inputted to the input terminal CP of the TFF 1. The output terminal Q of each TFF 1 to 5 is connected to the input terminal CP of each TFF 2 to 6 of the next stage. The reset terminal CDN of each TFF 1 to 6 is connected to the common terminal RSTN. The logic level of the output terminal Q of each TFF 1 to 6 changes to "H" when a reset signal is inputted from the terminal RSTN.

An output terminal of each 8-NAND gate B, C, D and an output terminal of a 7-NAND gate E are connected to each input terminal of a 4-NOR gate A while an input terminal D of the DFF 1 is connected to the output terminal of the 4-NOR gate A. The inversion output terminal QN of each DFF 1 to 8 is connected to each input terminal of the 8-NAND gate B. The inversion output terminal QN of each DFF 9 to 16 is connected to each input terminal of the 8-NAND gate C. The inversion output terminal QN of each DFF 17 to 24 is connected to each input terminal of the 8-NAND gate D. The inversion output terminal QN of each DFF 25 to 31 is connected to each input terminal of the 7-NAND gate E.

The inversion output terminal QN of each of the DFF 1, 16 and 17 is connected to each input terminal of the 4-NAND gate F in addition to the DFF 32 described above. The inversion output terminal QN of each of the DFF 2, 15, 18 and 31 is connected to each input terminal of the 4-NAND gate G. The inversion output terminal QN of each of the DFF 3, 14, 19 and 30 is connected to each input terminal of the 4-NAND gate H. The inversion output terminal QN of each of the DFF 4, 13, 20 and 29 is connected to each input terminal of the 4-NAND gate I. The inversion output terminal QN of each of the DFF 5, 12, 21 and 28 is connected to each input terminal of the 4-NAND gate J. The inversion output terminal QN of each of the DFF 6, 11, 22 and 27 is connected to each input terminal of the 4-NAND gate K. The inversion output terminal QN of each of the DFF 7, 10, 23 and 26 is connected to each input terminal of the 4-NAND gate L. These seven 4-NAND gates F to L constitute the pulse extraction circuit 3.

On the other hand, the output terminal of the 4-NAND gate F is connected to a control input terminal of a 3-state buffer M. The output terminal of the 4-NAND gate G is connected to a control input terminal of a 3-state buffer N. The output terminal of the 4-NAND gate H is connected to a control input terminal of a 3-state buffer O. The output terminal of the 4-NAND gate I is connected to a control input terminal of a 3-state buffer P. The output terminal of the 4-NAND gate J is connected to a control input terminal of a 3-state buffer Q. The output terminal of the 4-NAND gate K is connected to a control input terminal of a 3-state buffer R. The output terminal of the 4-NAND gate L is connected to a control input terminal of a 3-state buffer S. The output terminal Q of the TFF 6 is connected to the input terminal of each 3-state buffer M to S and a ZCLK signal as a basic cycle for generating a comparison waveform outputted from the TFF 6 is inputted. Therefore, the output of each 3-state buffer M to S is inputted to the integration circuit 5. Therefore, the output pulses of the 4-NAND gates F to L extracting the output pulses of the DFF 1 to 32 become ENABLE and DISABLE signals and control the outputs of the 3-state buffers M to S.

Figure 3:
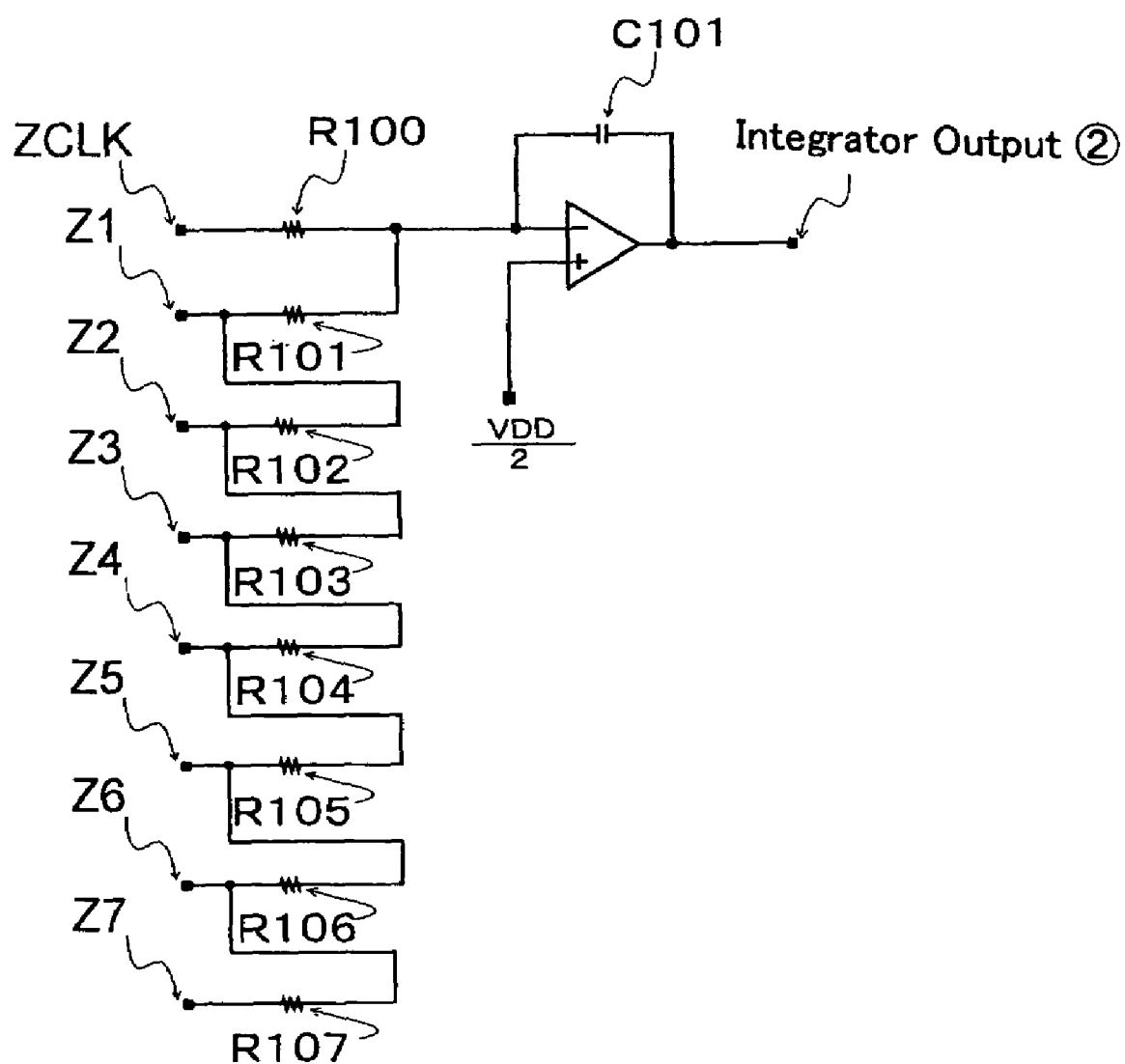
FIG. 3 is a block diagram showing a construction of an integration circuit.

Next, a construction of the integration circuit 5 will be explained with reference to FIG. 3. A feedback capacitance C101 is interposed between an opposite phase input terminal and an output terminal of an operational amplifier OP1. The opposite phase input terminal (−) of the operational amplifier OP1 is connected to the output terminal Q of the TFF 6 through a resistor R100. One of the ends of a resistor R101 is connected to the output terminal Z1 of the 3-state buffer M and the other end is connected to an intermediate part between the opposite phase input terminal (−) of the operational amplifier OP1 and the resistor R100. One of the ends of each resistor R102 to 107 is connected to an output terminal Z2 to Z7 of each 3-state buffer N to S. The other end of each resistor R102 to 107 is connected to an intermediate part between the output terminal Z1 to Z6 of each 3-state buffer M to R and each resistor R101 to 106 connected to the output terminal Z1 to Z6. The resistance value of each resistor 101 to 107 is set to be equal. On the other hand, the positive phase input terminal (+) of the operational amplifier OP1 is connected to a middle point potential of the power source voltage of the class D amplifier. When the potential of the power source vantage terminal VDD is 2.5 V and the potential of the later-appearing ground terminal GND is 0 V, for example, the positive phase input terminal (+) of the operational amplifier OP1 is connected to a constant voltage source, not shown, that generates the middle point potential of 1.25 V.

Figure 4:
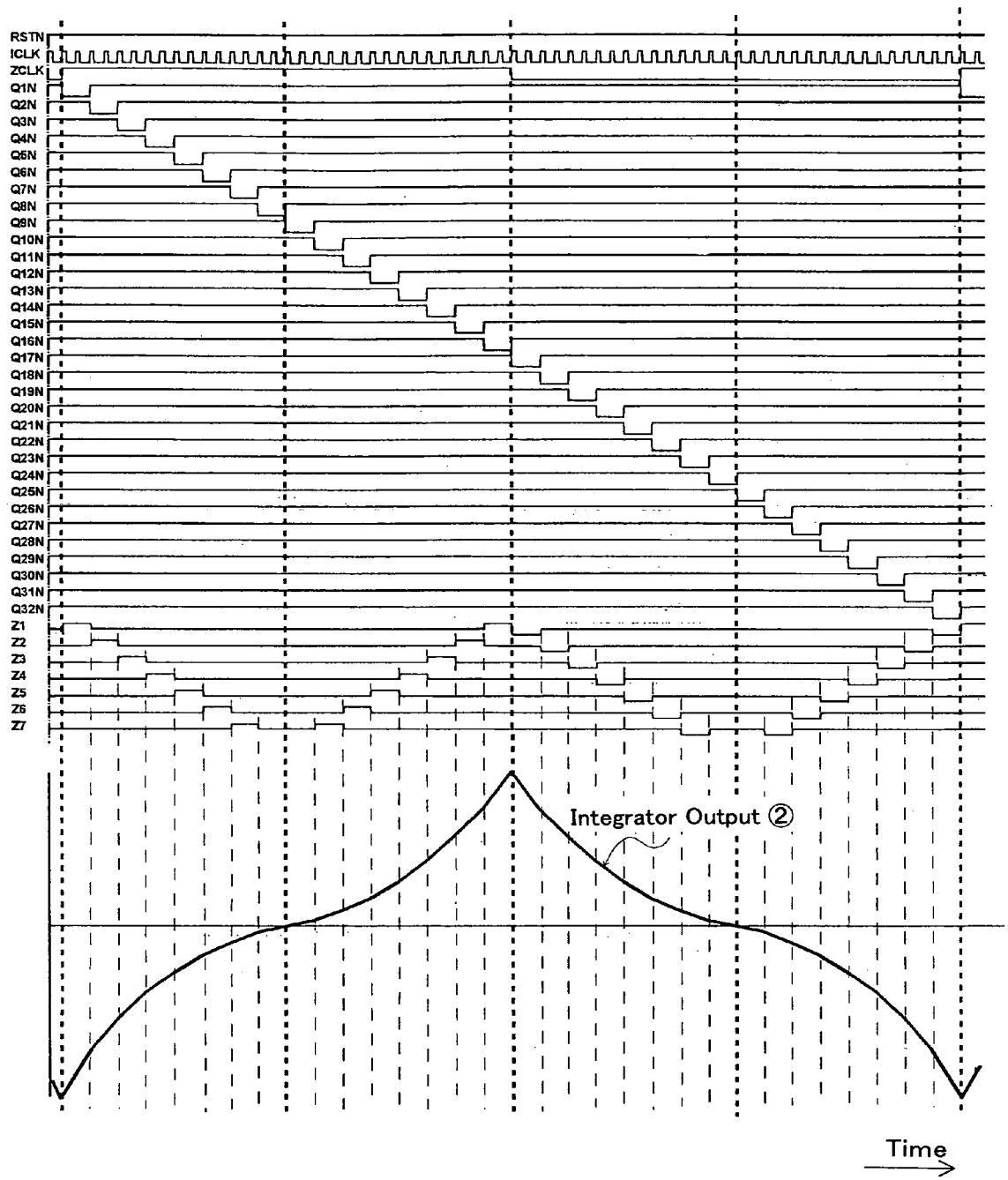
FIG. 4 is a timing chart for acquiring a deformed comparison triangular waveform.

The operation of the embodiment having the construction described above will be subsequently explained with reference to the timing chart of FIG. 4. In FIG. 4, symbol RSTN represents a reset signal. Symbol ICLK represents a clock pulse signal inputted to the TFF 1. Symbol ZCLK represents an output pulse signal from the TFF 6 obtained by frequency dividing ICLK by the TFF 1 to 6. Symbols Q1N to Q32N represent the output pulse signals from the inversion output terminals QN of the DFF 1 to 32, respectively. Symbols Z1 to Z7 represent the output signals of the 3-state buffers M to S, respectively. Incidentally, ZCLK forms the basic cycle for generating the comparison waveform that is inputted to the comparator 7.

The output Q1N to Q32N of the inversion output terminal QN of each DFF 1 to 32 changes to "H" when RSTN (reset signal) rises to "H". Therefore, the output of each 4-NAND gate F to L changes to "L". Since each 3-state buffer M to S is under the high impedance state, it is in the non-output state. The ICLK is inputted under this state to the TFF 1, the TFF 6 outputs the pulse signal and ZCLK changes to "H". The TFF 1 outputs the pulse signal, the output Q1N of the inversion output terminal QN of the DFF 1 changes to "L" and the output of the 4-NAND gate F changes to "H". The output Z1 of the 3-state buffer M changes to "H" for the period in which this output is inputted, in the same way as ZCLK. The output of the inversion output terminal QN of the DFF 2 to 7 of the next stage changes to "L" whenever the TFF 1 outputs the pulse signal in this way and the output of each 4-NAND gate G to L serially changes to "H". The output Z2 to Z7 of each 3-state buffer N to S serially changes to "H" for the period in which this output is inputted as the ENABLE signal to the control input terminal.

Similarly, the outputs of the inversion output terminals QN of the DFF 8 and 9 serially change to "L" in succession to the DFF 7. However, the inversion output terminal QN of each DFF 8, 9 remains merely connected to the input terminal of the 8-NAND gate B, C but is not connected to the input terminal of any of the 4-NAND gates F to L. Therefore, the ENABLE signal is not inputted to the control input terminal and all the 3-state buffers M to S are under the non-output state with high impedance.

Next, when the output Q10N of the inversion output terminal QN of the DFF 10 changes to "L", the output of the 4-NAND gate L changes to "H" and the output Z7 of the 3-state buffer S changes to "H" for the time in which this output is inputted as the ENABLE signal to the control input terminal in the same way as ZCLK. The output of the inversion output terminal QN of each DFF 11 to 16 of the next stage changes to "L" in this way whenever the TFF 1 outputs the pulse signal and the outputs of the 4-NAND gates K to F serially change to "H" in the sequence opposite to the above. The outputs Z6 to Z1 of the 3-state buffers R to M serially change to "H" in the same way as ZCLK for the time in which this output is inputted as the ENABLE signal to the control input terminal.

The signal ZCLK that is the output pulse signal of the TFF6 is inverted to change to "L" when the $33^{rd}$ ICLK is inputted to the TFF 1. The output Q1N of the inversion output terminal QN of the DFF17 changes to "L". The output of the 4-NAND gate F changes to "H". The output Z1 of the 3-state buffer M changes to "L" for the time in which this output is inputted as the ENABLE signal to the control input terminal, in the same way as ZCLK. The output of the inversion output terminal QN of the DFF 18 to 23 of the next stage changes to "L" in this way whenever the TFF 1 outputs the pulse signal and the outputs of the 4-NAND gates G to L serially change to "H". The outputs Z2 to Z7 of the 3-state buffers N to S serially change to "L" in the same way as ZCLK for the time in which this output is inputted as the ENABLE signal to the control input terminal.

Similarly, the outputs of the inversion output terminals QN of the DFF 24 and 25 serially change to "L" in succession to the DFF 23. However, the inversion output terminal QN of each DFF 24, 25 remains merely connected to the input terminal of the 8-NAND gate D, E but is not connected to the input terminal of any of the 4-NAND gates F to L. Therefore, the ENABLE signal is not inputted to the control input terminal of the 3-state buffers M to S and these 3-state buffers M to S are under the non-output state with high impedance.

Next, when the output Q10N of the inversion output terminal QN of the DFF 26 changes to "L", the output of the 4-NAND gate L changes to "H" and the output Z7 of the 3-state buffer S changes to "L" in the same way as ZCLK for the time in which this output is inputted as the ENABLE signal to the control input terminal. The output of the inversion output terminal QN of each DFF 27 to 32 of the next stage changes to "L" in this way whenever the TFF 1 outputs the pulse signal and the outputs of the 4-NAND gates K to F serially change to "H" in the sequence opposite to the above. The outputs Z6 to Z1 of the 3-state buffers R to M serially change to "L" in the same way as ZCLK for the time in which this output is inputted as the ENABLE signal to the control input terminal.

These outputs Z1 to Z7 are added to ZCLK and the sum is inputted to the operational amplifier OP1 of the integration circuit 5. The resistance value in this instance is R101 for Z1, R102+R101 for Z2, R103+R102+R101 for Z3, R104+R103+R102+R101 for Z4, R105+R104+R103+R102+R101 for Z5, R106+R105+R104+R103+R102+R101 for Z6 and R107+R106+R105+R104+R103+R102+R101 for Z7. Therefore, the time constant of the integration circuit 5 changes in a cycle having a pulse width that is 1/32 of the cycle of ZCLK. Consequently, the output waveform of the integration circuit 5 becomes the one that is shown in FIG. 4 as the triangular wave undergoes deformation in accordance with the outputs Z1 to Z7 of the 3-state buffers M to S.

When this deformed comparison waveform is inputted to the comparator 7 and is compared with the signal to be amplified, a comparator output shown in FIG. 5 can be acquired. Because the comparison waveform has the amplitude that is non-linearly increased in the proximity of the apex, the modulation ratio is not restricted sharply. The input/output characteristics shown in FIG. 6 can be acquired when the class D amplifier is driven with a single power source and a PWM signal is passed through the current buffer 8 and the low-pass filter 9 with the comparison waveform being the deformed triangular wave shown in FIG. 5.

Output with reduced distortion becomes possible by continuously limiting the modulation ratio above a specific level even at an input signal level at which the class D amplifier according to the prior art gets into saturation. It becomes also possible to improve a mean sound pressure level while reducing distortion even when large amplitude signals having waveforms with rich undulation such as music signals because the modulation ratio is continuously limited when such large amplitude is inputted.

Figure 7:
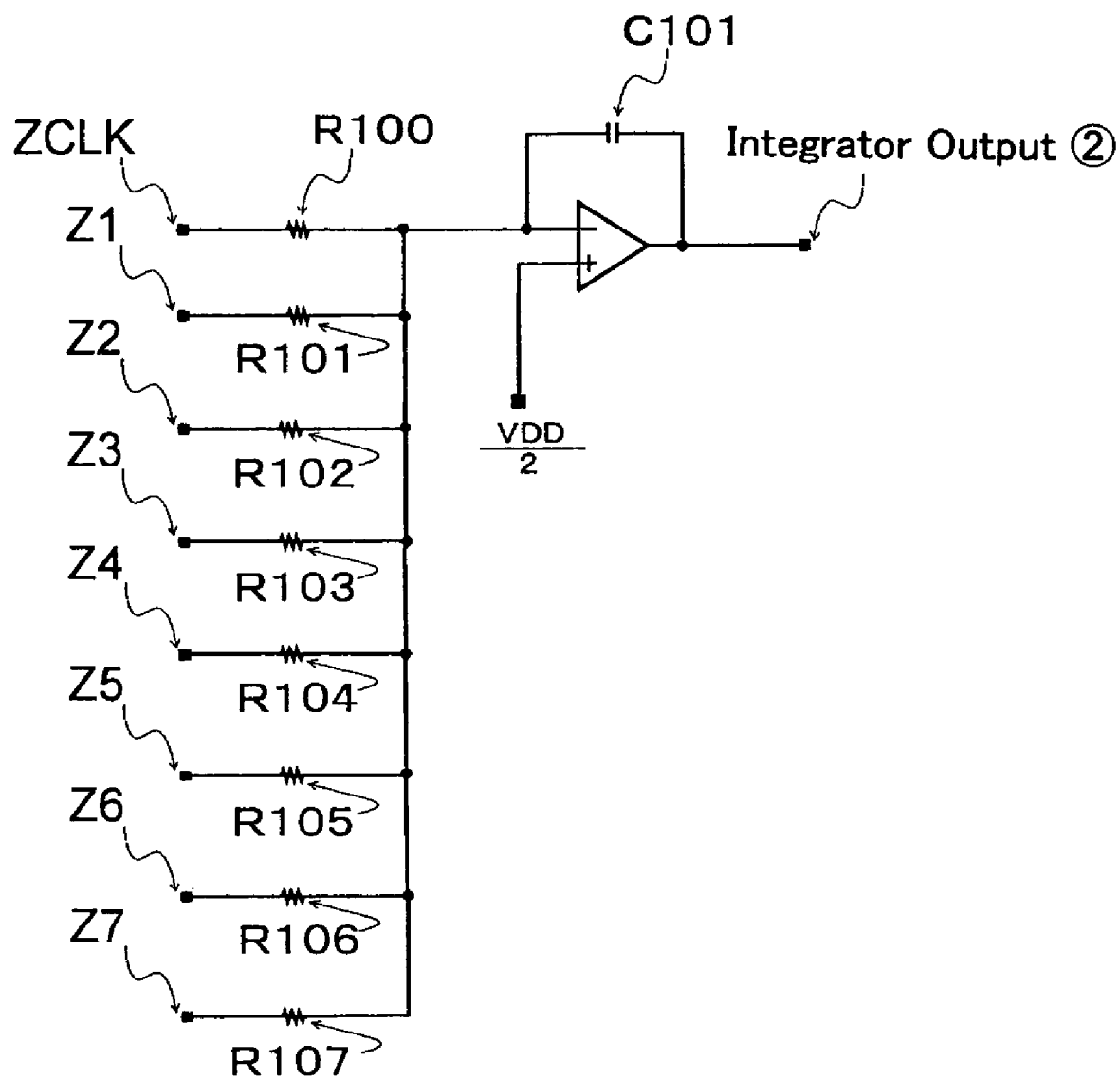
FIG. 7 is a block diagram showing another construction about connection of resistors in an integration circuit.

The invention is not particularly limited to the embodiment described above. For example, when the pulse generation circuit is constituted by 32 stages of ring counters, the number of the pulse extraction circuits can be set to the number obtained by dividing the maximum stage number described above by 4, and the pulse generation circuit can be constituted by 4-NAND gates of the number selected from 1 to 8. Sixteen 2-NAND gates can be employed in place of the 4-NAND gates F to L. In this case, sixteen 3-state buffers and sixteen resistors may well be prepared. Deformation of the triangular wave generated by this construction is asymmetric with respect to the zero-cross point. The pulse generation circuit is not particularly limited to the 32-stage ring counters, either. Connection of the resistors 101 to 107 in the integration circuit 5 is not limited to the connection shown in FIG. 3 and the connection shown in FIG. 7 can also be employed.

What is claimed is:

1. A class D amplifier including a triangular waveform generation circuit that generates a deformed triangular waveform used as a comparison waveform for amplitude modulating an analog input signal, the triangular waveform generation circuit comprising:
   a pulse generation circuit for generating a plurality of first pulse signals;
   a plurality of pulse extraction circuit for extracting said first pulse signals selectively, and for outputting second pulse signals during the time according to extracted first pulse signals;
   a plurality of three state buffers to which a clock pulse signal for basic cycles is provided as an input signal, one of said second pulse signals is provided as a control signal, and said clock pulse signal for basic cycles is output during a period for said one of second pulse signal is provided; and
   an integration circuit, having a time constant thereof changing in accordance with the output of said three state buffer, for generating said deformed triangular waveform corresponding to the time constant based on the clock pulse signal for basic cycles.

2. A class D amplifier according to claim 1, further comprising:
   a plurality of toggle flip flop circuits which are connected in series, for generating said clock pulse signal for basic cycles based on an externally-provided clock signal.

3. A class D amplifier according to claim 1, wherein said pulse generation circuit comprising:
   a ring counter including a plurality of delay flip flop circuits which are connected in series.

4. A class D amplifier according to claim 3, wherein each of said pulse extraction circuits comprising:
   a 4-NAND gate circuit to which four outputs chosen from among outputs of said delay flip flop circuits are inputted.

5. A class D amplifier according to claim 3, wherein each of said pulse extraction circuits comprising:
   a 2-NAND gate circuit to which two outputs chosen from among outputs of said delay flip flop circuits are inputted.

6. A class D amplifier according to claim 1, wherein said integration circuit comprising:
   an operational amplifier having a positive phase input terminal for receiving a middle point potential half level of a power source voltage of the class D amplifier, and a opposite phase input terminal for receiving said clock pulse signal for basic cycles via a first resistor, and output terminal;

a feedback capacitance interposed between said opposite phase input terminal and said output terminal of said operational amplifier; and a second resistor interposed between said opposite phase input terminal and an output of given 3-state buffer.

a third resistor interposed between an output said three state buffer and an output other 3-state buffer.

7. A class D amplifier according to claim 6, wherein a resistance value of said first resistor, second resistor and third resistor is set to be equal.

8. A class D amplifier according to claim 1, wherein said integration circuit comprising:

an operational amplifier having a positive phase input terminal for receiving a middle point potential half level of a power source voltage of the class D amplifier, and a opposite phase input terminal for receiving said clock pulse signal for basic cycles via a first resistor, and output terminal;

a feedback capacitance interposed between said opposite phase input terminal and said output terminal of said operational amplifier; and a second resistor interposed between said opposite phase input terminal and an output of given 3-state buffer.

a third resistor interposed between said opposite phase input terminal and an output of other 3-state buffer.

9. A class D amplifier according to claim 1, further comprising:

a sample-and-hold circuit for generating a sample-and-hold waveform based on an input signal;

a comparator for generating an amplitude modulated pulse signal of said input signal based on said sample-and-hold waveform and said deformed triangular waveform of said triangular waveform generation circuit;

a current buffer for buffering said amplitude modulated pulse signal; and a low-pass filter for filtering an output of said current buffer.

* * * * *